United States Patent [19]

Komaki et al.

[11] Patent Number: 5,080,975
[45] Date of Patent: Jan. 14, 1992

[54] COMPOSITE DIAMOND GRANULES

[75] Inventors: Kunio Komaki; Isamu Yamamoto; Takashi Fujimaki, all of Tokyo; Yoichi Hirose, Kitakatsushika, all of Japan

[73] Assignees: Showa Denko K. K., Tokyo; Yoichi Hirose, Saitama, both of Japan

[21] Appl. No.: 274,937

[22] PCT Filed: Mar. 23, 1988

[86] PCT No.: PCT/JP88/00299
§ 371 Date: Sep. 28, 1988
§ 102(e) Date: Sep. 28, 1988

[87] PCT Pub. No.: WO88/07599
PCT Pub. Date: Oct. 6, 1988

[30] Foreign Application Priority Data

Mar. 23, 1987 [JP] Japan .................. 62-65808
Apr. 23, 1987 [JP] Japan .................. 62-98657
Apr. 23, 1987 [JP] Japan .................. 62-98658

[51] Int. Cl.$^5$ .................. C01B 31/06; C23C 16/22
[52] U.S. Cl. .................. 428/404; 423/446; 427/215; 427/249; 427/255; 427/255.2; 427/255.3; 428/408; 501/56
[58] Field of Search ............ 428/403, 404, 405, 908.8; 51/307, 308, 309; 501/86; 427/215, 249, 255, 255.2, 255.3; 423/446

[56] References Cited

U.S. PATENT DOCUMENTS

| 3,630,678 | 12/1971 | Hardner | 423/446 |
| 3,630,679 | 12/1971 | Angus | 423/446 |
| 4,617,181 | 10/1986 | Yazu et al. | 423/446 |
| 4,816,286 | 3/1989 | Hirose | 427/39 |
| 4,859,493 | 8/1989 | Lemelson | 427/45.1 |
| 4,919,974 | 4/1990 | McCune et al. | 427/249 |
| 4,938,940 | 7/1990 | Hirose et al. | 423/446 |
| 4,960,643 | 10/1990 | Lemelson | 428/408 |
| 5,023,068 | 6/1991 | Jones | 423/446 |

FOREIGN PATENT DOCUMENTS

| 59-137311 | 8/1984 | Japan . |
| 60-231494 | 11/1985 | Japan . |
| 61-291493 | 12/1986 | Japan . |
| 69310 | 3/1990 | Japan | 423/446 |

OTHER PUBLICATIONS

Japanese Journal of Applied Physics, vol. 21, No. 4, (1982), S. Matsumoto, et al. [Vapor Deposition of Diamond Particles from Methane] P. L183-L185.

*Primary Examiner*—George F. Lesmes
*Assistant Examiner*—Christopher Brown
*Attorney, Agent, or Firm*—Oblon, Spivak, McClelland, Maier & Neustadt

[57] ABSTRACT

Composite diamond granules using granules of a ceramic substance line SiC as cores and covering the cores with a polycrystalline diamond coating are produced by the vapor phase method. The granules clearly manifest an automorphic diamond face and possess pyramidal projections, square faces, or rectangular faces on their surface. They are highly useful as abrasive granules for grinding. A grindstone obtained by mixing these granules with resin, metal, and vitrified binder and molding the resultant mixture is highly useful.

4 Claims, 1 Drawing Sheet

COMPOSITE DIAMOND GRANULES

TECHNICAL FIELD

This invention relates to composite diamond granules produced by the CVD method using ceramic or metallic particles as a core. The composite diamond granules of this invention can be suitably used as a granular abradant particularly for the abrasion of a surface and are advantageously used in the form of a grindstone obtained by mixing the composite diamond granules with resin, metal, a vitrified binder, and the like and molding the resultant mixture.

BACKGROUND ART

Diamond is the hardest substance known and has been used as a granular abradant. As a means for its manufacture, the ultra-high pressure method has been in use from a long time ago. In recent years, vapor phase methods (hereinafter referred to collectively as "CVD") of synthesizing diamond have been proposed. In CVD, though membrane diamond is produced mostly, granular diamond can be produced under certain conditions of production.

As one of the methods for the production of granular diamond there is a method which comprises preparing as cores minute diamond granules produced by the ultra-high pressure method and causing CVD diamond to be deposited on the periphery of the cores (Japanese Patent Publication SHO 48-32519 and Japanese Patent Public L Disclosure SHO 47-38794).

In the conventional method, the diamond granules used as cores are expensive and these diamond granules are obtained either by crushing large diamond grains or by classifying diamond dust which is produced during the cutting of diamond. These diamond granules are not easily obtained in a shape closely approximating a sphere because of their sharp edges, for example. It has been difficult, therefore, to produce diamond granules having a shape closely approximating a sphere by causing the core diamond described above to grow.

Where a granular abradant is used particularly for polishing the surface of a given object to high smoothness, the individual granules thereof are desired to be those of a shape closely approximating a sphere. Preferably these granules are mainly in a polycrystalline structure such that they reveal new crystal faces incessantly while they are being used for the abrasion.

Further single crystals of diamond are molded together with a substance as a matrix to produce a grindstone. In this case, the single crystals are not retained with ample fastness in the matrix substance. Generally, the fastness of the retention of the single crystals in the matrix is improved by having the surface of these single crystals coated in advance with a layer capable of promoting intimate contact with the matrix or having the single crystals subjected in advance to a surface treatment. For example, the diamond granules for resinoids are coated with nickel (50 to 60% by weight) by the electroless plating method to enhance their ability to make intimate contact with the matrix and improve their anchoring effect within the matrix.

Treatment of this type adds to the production cost of abrasive granules and grindstones. Moreover, since the coating is generously applied, it is difficult to maintain the desirable cutting ability.

An object of this invention is to provide composite diamond granules which are nearly spherical crystalline particles capable of retaining a surface particularly suitable for abrasion, exhibiting a highly desirable abrading ability as abrasive granules, and, on being molded together with a matrix substance to produce a grindstone, manifesting an ability to maintain intimate contact with the matrix substance and, therefore, obviate the necessity for any surface treatment.

DISCLOSURE OF THE INVENTION

To accomplish the object described above, this invention relates to composite diamond granules each comprising a ceramic or metallic granule not more than 30 $\mu$m in diameter and a single-crystal or polycrystalline diamond produced by CVD enclosing the ceramic or metallic granule and having an aspect ratio in the range of 1.0 to 1.3.

The aforesaid two types of diamond are aggregates of various microcrystals. These microcrystals include those of special crystal structures of cubic, tetrahedron and other structures having square faces, rectangular faces, and pyramidal projections. These microcrystals individually are mostly in the form of single crystals.

BEST MODE FOR CARRYING OUT THE INVENTION

Figure 1:
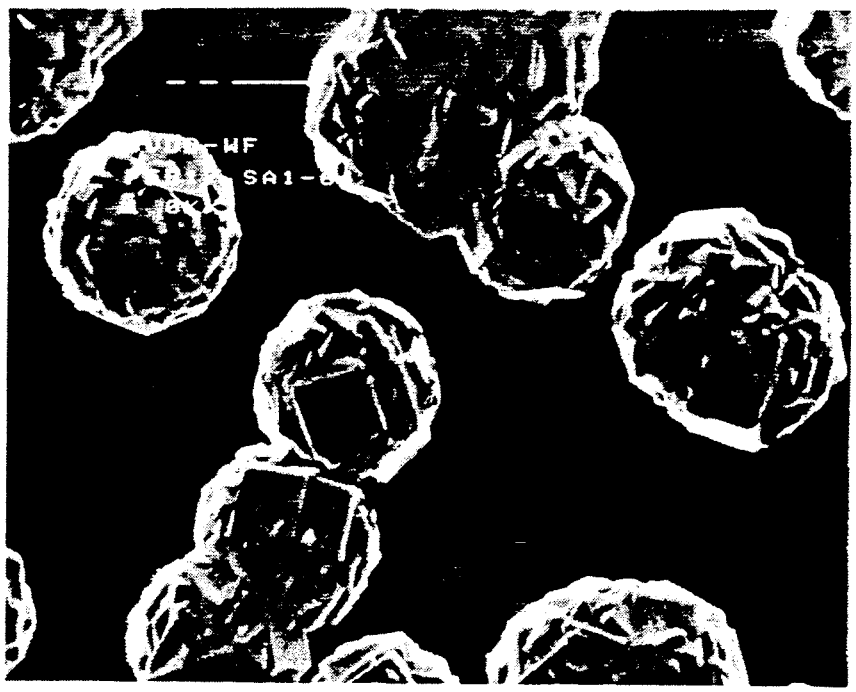
FIG. 1 is a scanning electron micrograph illustrating at 1,000 magnifications the crystal structure of composite diamond granules of this invention referred to in Example 2.

The inventors continued a study on the production of composite CVD diamond granules particularly with respect to core-forming materials and the morphology thereof. It has been consequently ascertained that ceramic or metallic granules are advantageously useful as cores for composite diamond granules in place of diamond granules and that such granules can be used particularly effectively when they have specific shape and size.

As examples of the substance useful advantageously as the material for the ceramic and metallic granules, SiC, WC, W, $W_2C$, TiC, MoC, TaC, $ZrO_2$, $Al_2O_3$, $TiO_2$, and $Y_2O_3$ can be cited.

Among these compounds, SiC proves to be particularly advantageous in terms of practicability because of ready availability and ease of manufacture of composite diamond granules. While SiC is classified into an $\alpha$ type and $\beta$ type, either of the two types can be indiscriminately used. In terms of mode of production, the SiC produced by any of the conventional methods such as the reduction method of silica with carbon and the pyrolytic method of organic silicon compounds can be used.

The shape of ceramic or metallic granules determines the shape of the composite diamond granules produced by deposition of diamond coating. The composite granules desirably have an aspect ratio (major diameter/minor diameter) in the range of 1.0 to 1.3. For the production of these composite diamond granules, ceramic or metallic granules having an aspect ratio in the range of 1.0 to 1.5 are most suitable. These granules are desired to have no sharp edges on their surface, if possible. If the ceramic granules have an unduly large diameter, it is difficult to control the shape of produced composite granules. Therefore, suitably, the diameter is not more than 30 μm.

The composite diamond granules of this invention have a CVD diamond coating deposited on the surface of ceramic or metallic granules. The desirable thickness of this coating varies with the size of the ceramic or metallic granules and is decided in consideration of the performance the product is expected to manifest as an abradant, the time required for deposition of the coating, and the like.

The practical and preferable shape of the composite diamond granules will be described below.

The thickness of the diamond coating is in the range of 0.1 to 100 times the average diameter of ceramic or metallic granules. If the thickness is smaller than 0.1 time the average diameter, the composite diamond granules do not manifest the characteristic quality of diamond in use. If the thickness is more than 100 times the average diameter, the production of composite diamond granules is difficult from the practical point of view.

Individually, the composite diamond granules have diameters generally in the range of 0.3 to 200 μm. Morphologically, they vary, including single crystal granules clearly showing automorphic diamond planes on the surfaces, composite granules having a coating formed of very minute diamond crystals, and granules having various coatings formed of crystals of square faces, rectangular faces, and pyramidal projections.

The height to the tips of the pyramidal projections is in the range of 1 to 20% of the diameter of spherical granules. The pyramidal projections are mostly trigonal pyramids or tetragonal pyramids. The granules are covered wholly with numerous pyramids.

In the case of granules having square faces and rectangular faces, these are conspicuously formed automorphically of (100) planes peculiar to diamond. The square faces and rectangular faces generally account for not less than 30% of the entire surface of the granules.

Now, the method for the production of the composite diamond granules of the present invention will be described below.

The method for production is vapor phase synthesis, which by selecting ceramic or metallic granules for cores and controlling the reaction conditions, attains deposition and growth of CVD polycrystalline or single-crystal diamond and eventual completion of composite granules in a controlled shape.

One working example of the method used for the production of composite diamond granules of this invention by the use of cores of SiC, a particularly desirable material, will be described below.

Where the SiC for the cores is produced in a spherical shape by the method of reduction of silica, the spheres are crushed mechanically to obtain the cores. This crushing is desired to be effected by attrition in a ball mill, for example, so that the crushed granules will be rounded to the fullest possible extent. The obtained granules have diameters of not more than 30 um. In the case of SiC granules produced by the pyrolysis of an organic silicon compound, they have diameters of the order of submicrons and aspect ratios in the range of 1.0 to 1.5 in most cases and, therefore, can be put to use in their unmodified form.

Then the SiC granules are scattered on a substrate such as of Si, Mo, W, WC, or $Al_2O_3$. One method usable for scattering the SiC granules with sufficient uniformity involves placing a container in which the SiC granules are dispersed in methanol in an ultrasonic liquid tank, subjecting the resultant dispersion in the container to ultrasonic waves for five minutes thereby ensuring thorough dispersion of the granules in methanol, dropping the dispersion on the substrate with a dropping pipette, and then allowing the dropped dispersion to dry spontaneously. The amount of the granules to be scattered varies greatly with the size of granules. Specifically, the amount by weight increases in proportion to the size of granules. Desirably, the amount generally falls in the range of 0.03 to 8 mg per $cm^2$ of the area of the substrate.

For the deposition of diamond, hydrocarbons such as methane and ethane, organic compounds containing C, H, and O such as alcohols and acetones, and these hydrocarbons and organic compounds further containing S, Cl, and N may be used. Optionally, the above said compounds may contain $H_2O$, CO, $CO_2$, $O_2$, etc. in small amounts. Generally, they are used diluted with $H_2$ gas. The excitation or decomposition with a gas is carried out by any of the conventional methods such as the plasma method using high frequency waves or microwaves, the arc discharge method, or the hot-filament method.

By this method, diamond is deposited on the SiC granules. The speed of this deposition in terms of thickness of the deposited diamond is in the range of 2 to 40 μm/hr.

This method permits production of composite diamond granules having an aspect ratio of 1.0 to 1.3 and comprising ceramic or metallic granules of diameters of not more than 30 μm and a diamond coating formed by CVD, enclosing the granules and clearly showing an automorphic crystal surface.

The diamond coating of the ceramic or metallic core may be enabled to assume a freely chosen one of the structures possessing pyramidal projections, square faces, and rectangular faces by suitably selecting the ceramic or metallic granules for the cores and the organic compound to form the diamond and adjusting such production conditions as the ratio of the organic compound/$H_2$, for example, in working the method described above.

For example, for the production of composite diamond granules of this invention possessing pyramidal projections, the ceramic such as SiC, or metallic granules to be used as their cores are desired to have been thoroughly crushed so as to have diameters of not more than 15 μm, preferably not more than 5 μm, contain very minute cracks, and possess lattice defects heavily. The organic compound/$H_2$ ratio is desired to be relatively high. To be more specific, the concentration of acetone is in the range of 0.8 to 1.5% by volume, that of ethanol in the range of 1.0 to 3.0% by volume, and that of t-butanol or n-propanol in the range of 0.6 to 1.5% by volume.

Particularly by the hot-filament method using as a raw material a mixture of acetone and/or butyl alcohol/$H_2$ in a concentration in the range of 1.0 to 1.3% by volume and using the conditions of a W-filament temperature in the range of 2,200 to 2,400° C. and a reaction pressure in the range of 75 to 760 Torrs, composite diamond granules possessing pyramidal projections are obtained in a highly desirable yield.

For the production of composite diamond granules of this invention possessing square faces or rectangular faces, the ceramic granules to be used as their cores are desired to be β-SiC granules which have been prepared by the vapor phase method and which, therefore, approximate single crystals, have diameters of the order of submicrons, specifically not more than 1 μm, preferably in the range of 0.1 to 0.7 μm, and possess low lattice defects. The organic compound/H$_2$ ratio used in this case is roughly equal to that used in the production of composite diamond granules containing pyramidal projections. To be more specific, the concentration of acetone is in the range of 0.8 to 1.5% by volume, that of ethanol in the range of 1.0 to 3.0% by volume, and that of t-butanol in the range of 0.6 to 1.5% by volume.

The composite diamond granules of the present invention may be used as a substitute for natural or synthetic diamond (ultra-high pressure method) having diameters in the range of 0.5 to 200 μm and used as abrasive granules. They are also available as a new material possessing a specific controlled particle shape for new applications involving lapping.

The granules of the present invention are enabled to acquire a specific particle shape and a narrow particle size distribution by adjusting such reaction conditions as reaction time. The composite diamond granules of a small particle diameter are suitable for surface abrasion of a material by lapping, for example. Since the individual granules closely resemble spheres, they do not inflict deep scratches on the blank. The diamond crystals are mutually bonded so that they incessantly show new crystal faces and retain a high abrading ability when they are worn during the course of abrasion. The composite diamond granules of a large particle diameter are formed by using a resinous, ceramic, or metallic binder and can be used in an abrasive grindstone or as a cutting material.

Though the diamond granules contain cores of SiC, for example, they can be safely used in the aforementioned applications as a lapping agent or as a grinding or cutting agent.

Figure 2:
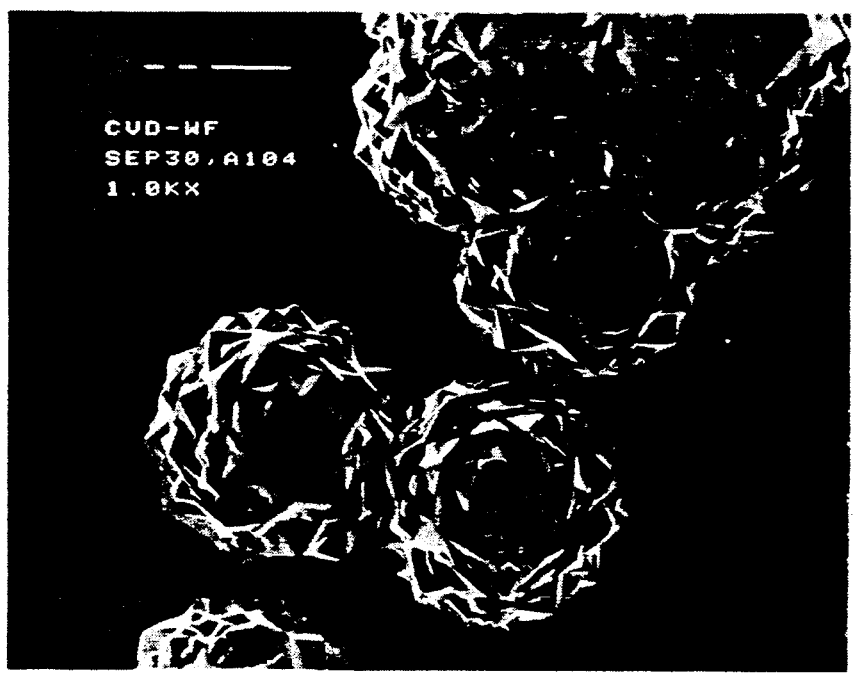
FIG. 2 is a scanning electron micrograph illustrating at 1,000 magnifications the crystal structure of composite diamond granules of this invention referred to in Example 3.

Particularly when the composite diamond granules of this invention possesses square faces or rectangular faces on the surface, since they possess such a surface structure as shown in the scanning electron micrograph of FIG. 2 mentioned in Example 3, they manifest a high anchoring effect in the matrix of resinous, metal, or ceramic material. A member which contains diamond particles using a matrix of such a material as mentioned above, therefore, exhibits an enhanced binding force with a binder. Since the square faces or rectangular faces which the diamond granules possess on their surface have edges of suitable sharpness in the corners, the diamond granules enjoy a high abrading quality and high wear resistance.

The composite diamond granules according to the invention not only possess the generally spherical shape required for lapping but also have on their surfaces square faces or rectangular faces with edges of suitable sharpness. Thus when they are used in a lapping machine, they alternately rotate and stop, which is ideal in a lapping operation. They have a high abrading ability as compared with spherical abrading particles.

Where the composite diamond granules have pyramidal projections all over their surface, they have a surface structure full of complicated irregularities as shown in FIG. 1 depicting the product of Example 2. When they are incorporated in a grindstone, they manifest a binding force with the matrix. Even when these granules have not been given any particular surface treatment, the retaining property the matrix manifests on the granules can be retained very satisfactorily. They do not suffer gradual loss of the abrading ability during the course of grinding because they have not been given the nickel-plating treatment of the kind performed on diamond granules used in the conventional grindstone.

EXAMPLE 1

α-SiC grains produced by the reduction of SiO$_2$ with carbon was pulverized in a ball mill and the crushed particles were classified to collect granules measuring 5 to 10 μm in diameter. The granules had aspect ratios in the range of 1.1 to 1.3. On a silicon substrate (a disc 3 cm in diameter), a suspension having the SiC granules dispersed in methanol by ultrasonic waves was applied dropwise. The deposited suspension on the substrate was left to dry spontaneously. The amount of SiC thus scattered was about 0.2 mg.

The substrate scattered with SiC was set in a diamond depositing device using the hot-filament method and treated therein for deposition of diamond. An acetone-hydrogen (acetone 1% by volume) mixed gas was used and fed to the device at a flow rate of 100 cc/min. The filament was made of tungsten and heated to 2,300° C. The substrate temperature was 650° C. and the distance between the substrate and the filament was about 3 mm. When the device was operated for two hours under the conditions mentioned above, there were obtained polycrystalline diamond granules containing SiC cores and mostly measuring 20 to 30 μm in diameter. The deposited product was identified to be diamond by X-ray diffraction.

EXAMPLE 2

α-SiC grains produced by the reduction of SiO$_2$ with carbon was pulverized in a ball mill and the crushed particles were classified to collect granules having an average diameter of 3 μm. The granules had aspect ratios in the range of 1.1 to 1.3. A suspension obtained by dispersing the α-SiC granules in methanol by ultrasonic waves was applied dropwise on a circular silicon plate (110 plane) 3 cm in diameter. The resultant product on the substrate was left to dry spontaneously. Thus a substrate for hot-filament was obtained. The amount of SiC scattered was about 0.2 mg.

Then, the substrate was set within a hot-filament reaction chamber using a filament of tungsten 0.3 mm in diameter. The reaction chamber was operated for two hours, with the substrate temperature fixed at 700° C., the acetone/H$_2$ ratio at 1.3% by volume, the pressure at about 190 Torrs, and the W-filament temperature at 2,300° C.

After completion of the reaction, the product deposited on the substrate was tested for crystal structure under a scanning electron microscope and further with X-ray diffraction. It was consequently confirmed that polycrystalline diamond granules having diameters in the range of 25 to 40 μm (average diameter 30 μm) were covered with pyramidal projections. A 1,000-magnification scanning electron micrograph illustrating this crystal structure is shown in FIG. 1. The polycrystalline diamond granules contain α-SiC granules as their cores.

EXAMPLE 3

Within a hot-filament reaction chamber using a tungsten filament, a solution obtained by causing an ultrafine α-SiC powder (not more than 1 μm in diameter) synthesized from silane by the RF plasma method to be dispersed in the form of a suspension by ultrasonic wave was applied by spraying on a Si wafer (100) substrate.

The applied solution was left to dry spontaneously. The Si substrate disposed at a distance of 3 mm directly below the W filament was heated with a Nichrome-wire heater so as to keep the Si substrate at 800° C. The filament temperature was 2,300° C.

Then, a mixture of $(CH_3)_2CO$ and $H_2$ containing $(CH_3)_2CO$ in a concentration of 1.2% by volume was kept under pressure of 760 Torrs and fed to the reaction chamber at a flow rate of 150 cc/min for two hours to induce reaction. After completion of the reaction, the reaction product was left to cool to room temperature and removed from the reaction chamber.

On observation under an optical microscope, the product was found to comprise granules having diameters in the range of 15 to 20 $\mu$m and possessing numerous whitish transparent square faces or rectangular faces on the surface. On analysis with a thin layer X-ray diffractometer, the granules were identified to be diamond.

A 1,000-magnification scanning electron micrograph illustrating the crystal structure of the granules mentioned above is shown in FIG. 2. The granules show numerous square faces and rectangular faces on their surface.

It will be noted from the micrograph that the granules have diameters in the range of 15 to 35 $\mu$m.

The polycrystalline diamond granules contain $\beta$-SiC cores therein.

We claim:

1. A composite diamond granule having a diameter of not more than 30 $\mu$m and an aspect ratio in the range of 1.0 to 1.3, and comprising:

a core of ceramic or metallic granule which consists of at least one member selected from the group consisting of SiC, WC, W, $W_2C$, TiC, MoC, TaC, $ZrO_2$, $Al_2O_3$, $TiO_2$, and $Y_2O_3$ and is thoroughly crushed so as to have a diameter of not more than 15 $\mu$m and an aspect ratio in the range of 1.0 to 1.5, contain very minute cracks and possess high lattice defects; and a polycrystalline diamond coating having pyramidal projections formed on the surface thereof, enclosing said core, and produced by the vapor phase method using one member selected from the group consisting of a mixed gas of hydrogen and acetone having a concentration of 0.8 to 1.5% by volume to said hydrogen, a mixed gas of hydrogen and ethanol having a concentration of 1.0 to 3.0% by volume to said hydrogen, a mixed gas of hydrogen and t-butanol having a concentration of 0.6 to 1.5% by volume to said hydrogen, and a mixed gas of hydrogen and n-propanol having a concentration of 0.6 to 1.5% by volume to said hydrogen.

2. The composite diamond granule according to claim 1, wherein said core is a granule obtained by crushing SiC produced by the method of reduction of silica.

3. A composite diamond granule having a diameter of not more than 30 $\mu$m and an aspect ratio in the range of 1.0 to 1.3, and comprising:

a core of ceramic or metallic granule which consists of at least one member selected from the group consisting of SiC, WC, W, $W_2C$, TiC, MoC, TaqC, $ZrO_2$, $Al_2O_3$, $TiO_2$ and $Y_2O_3$, approximates a single crystal and has a diameter of not more than 1 $\mu$m, low lattice defects and an aspect ratio in the range of 1.0 to 1.5; and a polycrystalline diamond coating having square or rectangular faces formed on the surface thereof, enclosing said core, and produced by the vapor phase method using one member selected from the group consisting of a mixed gas of hydrogen and acetone having a concentration of 0.8 to 1.5% by volume to said hydrogen, a mixed gas of hydrogen and ethanol having a concentration of 1.0 to 3.0% by volume to said hydrogen and a mixed gas of hydrogen and t-butanol having a concentration of 0.6 to 1.5% by volume to said hydrogen.

4. The composite diamond granule according to claim 3, wherein said core consists of SiC.

* * * * *

UNITED STATES PATENT AND TRADEMARK OFFICE
CERTIFICATE OF CORRECTION

PATENT NO. : 5,080,975
DATED : JANUARY 14, 1992
INVENTOR(S) : KUNIO KOMAKI ET AL.

It is certified that error appears in the above-identified patent and that said Letters Patent is hereby corrected as shown below:

Column 2, line 25, "1"

should read --2--.

Column 2, line 29, "2"

should read --1--.

Column 6, line 61, "1"

should read --2--.

Column 7, line 26, "2"

should read --1--.

Signed and Sealed this

Twenty-sixth Day of November 1996

*Attest:*

BRUCE LEHMAN

*Attesting Officer*     *Commissioner of Patents and Trademarks*